United States Patent [19]
Butterbaugh et al.

[11] Patent Number: 6,107,166
[45] Date of Patent: Aug. 22, 2000

[54] VAPOR PHASE CLEANING OF ALKALI AND ALKALINE EARTH METALS

[75] Inventors: Jeffery W. Butterbaugh, Eden Prairie, Minn.; Herbert H. Sawin, Chestnut Hill, Mass.; Zhe Zhang, Irvine, Calif.; Yong-Pil Han, Boston, Mass.

[73] Assignees: FSI International, Inc., Chaska, Minn.; Massachusetts Institute of Technology, Cambridge, Mass.

[21] Appl. No.: 08/924,725

[22] Filed: Aug. 29, 1997

[51] Int. Cl.[7] .................................................. H01L 21/322
[52] U.S. Cl. .......................... 438/477; 438/906; 510/175; 510/511; 134/31; 252/79.4; 216/79
[58] Field of Search ..................................... 438/706, 477, 438/906; 216/79; 134/31; 510/175, 511; 252/79.4

[56] References Cited

U.S. PATENT DOCUMENTS

| | | | |
|---|---|---|---|
| 4,107,388 | 8/1978 | Gambaretto et al. | 428/428 |
| 4,749,440 | 6/1988 | Blackwood et al. | 156/646 |
| 5,022,961 | 6/1991 | Izumi et al. | 156/646 |
| 5,094,701 | 3/1992 | Norman et al. | 148/23 |
| 5,213,621 | 5/1993 | Ivakovits et al. | 134/3 |
| 5,213,622 | 5/1993 | Bohling et al. | 134/3 |
| 5,221,366 | 6/1993 | Roberts et al. | 148/22 |
| 5,332,444 | 7/1994 | George et al. | 134/1 |
| 5,348,619 | 9/1994 | Bohannon et al. | 156/664 |
| 5,439,553 | 8/1995 | Grant et al. | 216/58 |
| 5,578,133 | 11/1996 | Sugino et al. | 134/2 |
| 5,580,421 | 12/1996 | Hiatt et al. | 150/643.1 |
| 5,589,422 | 12/1996 | Bhat | 437/228 |

FOREIGN PATENT DOCUMENTS

| | | |
|---|---|---|
| WO 94/27315 | 11/1994 | WIPO . |
| 96/19825 | 6/1996 | WIPO . |
| 97/15069 | 4/1997 | WIPO . |

OTHER PUBLICATIONS

Jeffery W. Butterbaugh et al, "Gas–Phase Etching of Silicon Oxide With Anhydrous HF and Isopropanol", *Proceedings of The Third International Symposium on Cleaning Technology in Semiconductor Decvice Manufacturing*, vol. 94–7 (1994).

L. Li et al., "Improvement of High Temperature Water Rinsing and Drying for HF–Last Wafer Cleaning", *J. Electrochem. Soc.*, vol. 143, No. 1, 233–237 (1996).

N. F. Raley et al., (100) Silicon Etch–Rate Depedence on Boron Concentration in Ethylenediamine–Pyrocatechol–Water Solutions, *J. Electrochem. Soc.: Solid–State Science and Technology*, vol. 131, No. 1, 161–171, Jan. 1984.

H. Seidel et al., "Anisotropic Etching of Crystalline Silicon in Alkaline Solutions, II. Influence of Dopants", *J. Electrochem. Soc.*, vol. 137, No. 11, 3626–3632, Nov. 1990.

J.P. Holmes, et al, "A Vapour Etching Technique for the Photolithography of Silicon Dioxide," *Microelectronics and Reliability*, 5 pp 337–341 (1996).

K. Beyer, et al, "Etching of $SiO_2$ in Gaseous $HF/H_2O$," *IBM Technical Bulletin*, 19(7) (Dec. 1976).

A. Izumi, et al, "A New Cleaning Method by Using Anhydrous $HF/CH_3OH$ Vapor System," J. Ruzyllo et al, ed., *Symposium on Cleaning Technology in Semiconductor Device Manufacturing, ECS Proceedings*, 92(12), pp 260–266 (1992).

*Primary Examiner*—Randy Gulakowski
*Assistant Examiner*—Allan Olsen
*Attorney, Agent, or Firm*—Vidas, Arrett & Steinkraus

[57] ABSTRACT

A process for removing a Group I or Group II metal species from a surface of a semiconductor substrate. The process comprises exposing the surface to a gaseous reactant mixture comprising HF, a second compound and a silane compound, and removing volatile products from the surface. The invention is further directed to a process for etching oxides from a semiconductor substrate comprising exposing the surface to a gaseous reactant mixture comprising HF, a second compound and a silane compound, and removing volatile products from the surface.

25 Claims, 1 Drawing Sheet

AFTER $HF/H_2O-N_2/N_2SiF_4$ (d)
AS CONTAMINATED (c)
AFTER $HF/H_2O-N_2/N_2$ (b)
AS CONTAMINATED (a)

AFTER HF/H$_2$O-N$_2$/N$_2$SiF$_4$ (d)

AS CONTAMINATED (c)

AFTER HF/H$_2$O-N$_2$/N$_2$ (b)

AS CONTAMINATED (a)

VAPOR PHASE CLEANING OF ALKALI AND ALKALINE EARTH METALS

FIELD OF THE INVENTION

This invention relates to a method for removing sodium and other Group 1 and Group 2 metals from the surface of a semiconductor substrate.

BACKGROUND OF THE INVENTION

Under reasonable conditions of temperature below about 100° C. and pressures of about 2 atmospheres or less, gas phase etch of silicon oxide using anhydrous HF is generally impractical without a second chemical which participates in some way to allow the etch reaction to proceed at a practical rate. A variety of chemicals which facilitate silicon oxide removal with HF are known in the art, including water, alcohols, ketones and some carboxylic acids. Such compounds are liquids at ambient pressure and temperature. Similarly, U.S. Pat. Nos. 5,094,701, 5,221,366, 5,213,621, 5,213,622, and 5,332,444 describe techniques for gas phase removal of metals, metal nitrides or metal oxides which employ HF and a second chemical, such as a beta-diketone, beta-ketoimide, halogenated carboxylic acid or hexamethyl disilazane which functions as a complexing reagent to produce volatile metal-ligand complexes which then can be sublimed from the surface.

It has long been known that gas phase HF/water mixtures can be used to etch various silicon oxide films. Early references include J. P. Holmes, et al, "A Vapor Etching Technique for the Photolithography of Silicon Dioxide," *Microelectronics and Reliability*, 5 pp 337–341 (1966); and K. Beyer, et al, "Etching of $SiO_2$ in Gaseous $HF/H_2O$," *IBM Technical Bulletin*, 19(7) (December 1976), both of which used a HF/water azeotrope.

In U.S. Pat. No. 4,749,440 (Blackwood), a process for removing silicon oxide films from silicon wafers using anhydrous HF gas and water vapor carried in a nitrogen stream is disclosed. The use of anhydrous HF provides improved process control. An ambient pressure apparatus for performing this process is currently commercially available from FSI International, Inc., under the trademark Excalibur®.

Various publications describe gas-phase HF/alcohol processes for etching silicon oxide.

U.S. Pat. No. 5,022,961, (Izumi), describes a process for removing a film of a silicon oxide, from a silicon substrate. Two steps are identified:
  (a) placing the substrate in a reaction chamber to be isolated in an air-tight manner from the outside air, and
  (b) feeding anhydrous hydrogen fluoride and alcohol simultaneously into the reaction chamber.

The reference indicates that the HF/alcohol feeds may be as liquid solutions or gas mixtures. A similar disclosure of an ambient pressure gas phase etch process is contained in A. Izumi, et al, "A New Cleaning Method by Using Anhydrous $HF/CH_3OH$ Vapor System," J. Ruzyllo et al, ed., *Symposium on Cleaning Technology in Semiconductor Device Manufacturing, ECS Proceedings*, 92(12), pp 260–266 (1992).

WO 94/27315 discloses gas phase etching of oxide layers with hydrogen fluoride and one or more carboxylic acids.

U.S. Pat. No. 5,439,553 (Grant, et al), issued Aug. 8, 1995 from an application filed in the United States on Mar. 30, 1994, describes and claims a low pressure process for removing silicon oxide from a wafer substrate in which an HF/alcohol gas mixture is used at a low pressure.

J. Butterbaugh, et al, "Gas Phase Etching of Silicon Oxide with Anhydrous HF and Isopropanol," *Proceedings of the Third International Symposium on Cleaning Technology in Semiconductor Device Manufacturing, ECS Proceedings*, 94(7) pp 374–383 (1994), describe a low pressure HF/isopropanol etch process for silicon oxide.

Low pressure processes generally are of increasing interest as cluster tools come into use in the semiconductor manufacturing industry. Cluster tools link a series of separate process modules via a central robotic handler, operating at a pressure of about 100 torr or less, allowing substrates such as silicon wafers to undergo multiple sequential processes without exposure to the environment. Such environmental isolation is becoming increasingly important as device features shrink, causing smaller and smaller contaminant regions to become problematic, and ultralarge scale integration increases the investment represented in each defective chip.

WO 97/15069 is directed to a process for removing Group 4–13 metallic material from a substrate using a reactive halogen component and also an activated halosilane component.

Copending U.S. application Ser. No. 08/824,512 filed Mar. 26, 1997, the contents of which are hereby incorporated by reference, discloses an apparatus and method for direct delivery of enabling chemical gas from a liquid source and of HF gas in a hydrogen fluoride/enabling chemical based cleaning or etching process, such as a silicon dioxide film etching process. As used therein the term "enabling chemical" refers to second chemicals which participate in the cleaning or etching process as a catalyst, co-reactant, and/or complexing agent.

SUMMARY OF THE INVENTION

The present invention is directed to a process for treating a surface of a semiconductor substrate. The process comprises:
  a) exposing the surface in a process chamber to a gaseous reactant mixture comprising:
    i) HF; and
    ii) a second compound selected from the group consisting of water and oxygenated organic compounds, and
  b) removing volatile products from the process chamber, wherein
  the gaseous reactant mixture further comprises
    iii) a silane compound, selected from the group consisting of halosilanes, tetraalkoxysilanes and hexamethyldisilazane.

The process of the invention can advantageously be used to remove Group 1 and 2 metal species from the surface of a semiconductor substrate comprising silicon oxide. It may also be usefully employed on substrates which do not include silicon oxide or it may be practiced in a manner which does not result in substantial etching of silicon oxide. It may further be used to remove silicon oxide uniformly from the surface of a semiconductor substrate.

A particularly unexpected feature of the invention is that the halosilane $SiF_4$, which works especially well in the inventive process, is generally accepted to be a byproduct of gas-phase $HF/H_2O$ or HF/alcohol silicon oxide etch reactions which needs to be removed from the system to drive the etch reaction. Adding this, or another silane component to the reactant mixture is considered counter-intuitive.

DETAILED DESCRIPTION OF THE INVENTION

Figure 1:
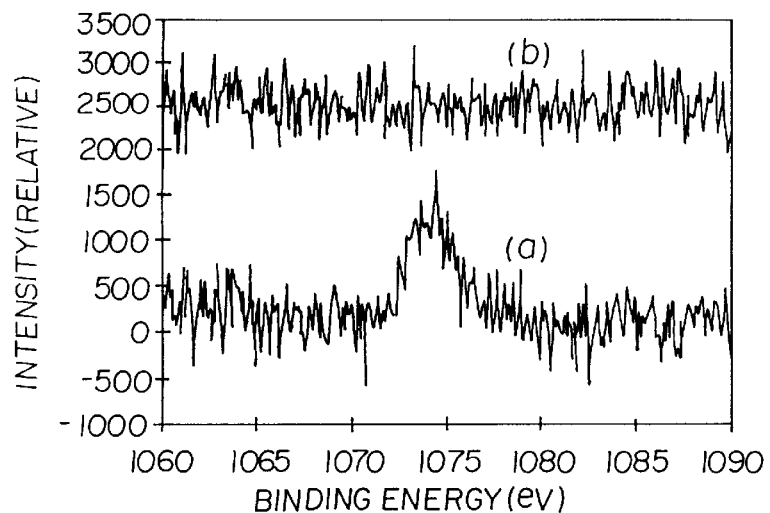
FIG. 1 is a graph showing two sodium 1s XPS spectra of the surface of a sodium contaminated silicon wafer, taken before and after a treatment using the inventive process.

The present invention is directed to a process for treating a surface of a semiconductor substrate in which a Group 1 or Group 2 metal species, especially Na, K, and Ca, residing thereon is removed.

In the gaseous reactant mixture utilized in the invention, the HF component is preferably provided from a separate source of anhydrous HF in order to provide better control of the system, as described in U.S. Pat. No. 4,749,440. However, it is also possible to practice the invention using a gas phase HF-comprising mixture obtained by vaporizing a liquid solution of HF and water or an oxygenated organic compound such as an alcohol.

The second chemical component of the gaseous reactant mixture, water or an oxygenated organic compound, may suitably be provided by direct vaporization, as described in copending application Ser. No. 08/824,512, or it may be provided diluted in a carrier gas, for instance by bubbling dry nitrogen through liquid form of the second chemical or by spraying the liquid form second chemical into a flowing stream of dry nitrogen. Oxygenated organic compounds which may be employed in the practice of the invention as the second chemical include alcohols such as methanol, ethanol or isopropanol; aldehydes such as formaldehyde or acetaldehyde; ketones such as acetone or methyl ethyl ketone; and carboxylic acids such as formic acid and acetic acid. Halogen substituents may optionally be present on the oxygenated organic compound but are preferably not present.

The silane compound component of the gaseous reactant mixture is selected from the group consisting of halosilanes, tetraalkoxysilanes and hexamethyldisilazane (HMDS). The halosilanes may be of the form $Si_aF_bCl_c$ where a is a positive integer, suitably 1 or 2, and b and c are positive integers or 0 and 2a+2=b+c, or they contain hydrogen or methyl groups thereon in addition to halogen atoms. Specific examples of the silane component include $SiF_4$, $SiCl_4$, $SiFCl_3$, HMDS, tetraethoxysilane (TEOS), tetramethoxysilane, trifluoromethylsilane. $SiF_4$ is particularly efficacious for use in the present invention.

While the use of an inert carrier gas is not necessary to practice the invention, it will generally be desirable to provide the gaseous reactant mixture to the process chamber diluted with an inert carrier gas. Suitable carrier gases include argon, neon, nitrogen, xenon and krypton, although other gases may be used as well.

The mechanism by which the use of the silane compound facilitates removal of the Group 1 or Group 2 metal is not specifically known but it is believed that the metal is incorporated into a volatilizable compound which also includes silicon and oxygen therein. The use of added silane compound is believed to promote the formation and/or removal of such volatilizable compounds, compared to the dynamic mixture of $HF/H_2O$ or HF/alcohol reactant and fluorosilicon reaction product obtained during a conventional etch process of the prior art.

The process of the invention may be employed advantageously over a wide range of process parameters. For example, the process pressure may be varied over the range of 10 torr to 850 torr, with a range of from about 40 to about 500 torr being preferred; total gas flow may range from 200 sccm to 30,000 sccm or more as wafer sizes and chamber sizes increase in the future; the amount of HF in the gas provided to the process chamber may be varied from approximately 0.1 to approximately 75% HF; similarly the amounts of second chemical may be varied from about 1 to about 75% of the total gas mixture; an optional carrier gas may also be used; the process time may be varied from 1 second up to several minutes, depending on amount of material to be removed and the other process parameters selected; and the process temperature may range from about 0 to about 100° C., preferably from about 20° C.–45° C. The silane compound may suitably be employed in the reactant gas mixture in an amount of about 10 ppm to about 1000 ppm, preferably, 100 ppm to about 400 ppm, the amount kept below the level in which silicon deposition is observed. Note that for the purposes of this application, 'ppm' is measured volumetrically.

An ambient pressure, apparatus for performing this kind of process is currently commercially available from FSI International, Inc., under the trademark Excalibur®. At below ambient pressures, an apparatus such as that described in U.S. Pat. No. 5,580,421 and copending applications WO 96/19825 and U.S. application Ser. No. 08/824, 512 may be used for performing the present invention.

By way of example, in a treatment procedure for removing residual sodium from an 8 inch square silicon wafer substrate after a photoresist ashing process, a gas mixture comprising a mixture of 1% HF, 1% $H_2O$ or isopropanol as the second chemical, 100 ppm $SiF_4$ and the balance dry $N_2$ carrier gas is provided to a process chamber containing the substrate at a pressure of 800 Torr and a total gas flow rate of about 26,000 sccm. The substrate is maintained at 20° C.–25° C. and the reactant gas mixture is flowed into the chamber for a period of about 5 seconds. Before and after the treatment dry nitrogen is flowed into the chamber to establish a stable inert condition.

While the present invention will be of particular use with silicon containing substrates, other substrates such as gallium arsinide and germaniun based substrates may also be used. It is desirable that the substrate comprises an oxide although surfaces that are at least substantially oxide free may be used as well. The substrate may comprise a semiconductor coating, for example a non-conducting base with a semi-conductor coating, such as a display panel. The surface of the substrate may further comprise additional layers of material such as an ashed photoresist layer which is to be removed. The inventive process may be useful when employed in conjunction with the post-ash residue removal technique disclosed in U.S. Pat. No. 5,348,619 to Bohannon and Syverson.

The inventive process can be advantageously employed for Group 1 and 2 metals removal even in $HF/H_2O$ etching of thick silicon oxides. Although relatively high levels of $SiF_4$ may be produced in-situ during such a process, distribution thereof in the reaction chamber and/or on the substrate surface may be non-uniform, especially at high flow rates. The inventive process can give improved uniformity in such situations.

The inventive process may also be practiced using active oxygen in place of or in addition to water or oxygenated organic compounds. The active oxygen may be ozone. Alternatively, the active oxygen may be produced by flowing oxygen gas into the reaction chamber over the surface and subjecting the oxygen gas to ultraviolet or higher energy radiation. The activated oxygen may be supplied simultaneously with the provision of the HF, silane compound and an optional oxygenated organic compound or water or prior to providing the HF, silane compound and optional oxygenated organic compound or water.

It is also believed that the inventive process may also be practiced without the use of the oxygenated organic compound, water or active oxygen by providing HF and a silane compound to the surface of the substrate.

The inventive process is also considered to provide advantageous improvement in silicon oxide etch uniformity under high gas flow rate conditions. This advantage is independent of the presence of sodium or another Group 1 or 2 metal.

EXAMPLES

In the following examples a cluster apparatus was used which allowed for 1 cm² samples to be introduced via a load-lock device and moved between various separately isolatable chambers at a base pressure of about $10^{-7}$ Torr. The apparatus was provided with an analytical chamber including an X-ray Photoelectron Spectrometer for X-ray Photoelectron Spectroscopy (XPS) and a process chamber designed for HF gas processing at pressures between 40 Torr and ambient pressure.

Na 1s XPS spectra of the surface of the silicon wafers were acquired with 50 msec dwell times, 0.1 eV steps, and 50 eV pass energies. The Na 1s binding energy exhibited its strongest XPS signal at 1071.4 eV. The detection limit of the XPS setup for Na was better than 0.5% monolayer of Na coverage. Note that due to charging problems, shifts in the XPS peak position were observed. The spectra were taken on wafers contaminated with sodium as indicated below before and after processing with the HF-containing reactant gas mixtures.

Example 1

A 1 cm² silicon sample was contaminated by dissipating one drop of 1 ppm NaOH solution on the surface of the wafer. The contaminated wafers were placed in a reaction chamber and treatment gas (HF/H$_2$O/SiF$_4$) injected in a stagnation flow configuration over the surface of the silicon wafer. All of the gases were mixed before entering the chamber except for the purging nitrogen gas. The water vapor pressure was maintained at a temperature of 40° C. while the chamber temperature was maintained at about 45° C. by bubbling 60 sccm of nitrogen gas at a pressure of 15 psig through water at 40° C. The process pressure was maintained at 250 torr. For the HF/H$_2$O/SiF$_4$ process the flowrates were 30 sccm of HF, 60 sccm of nitrogen and 100 sccm of SiF$_4$ mixture. The SiF$_4$ mixture was 560 ppm SiF$_4$ in nitrogen gas. The process was run for 12 minutes.

FIG. 1 demonstrates the effectiveness of the inventive process in removing sodium from the surface of the substrate. Spectrum a), a Na 1s XPS spectrum was acquired prior to sodium removal while spectrum b) was acquired after the process. The sodium peak that was clearly visible at 1071 eV pre-treatment is no longer present to the limits of detection following treatment demonstrating the removal of sodium by the present process.

Comparative Example and Example 2

In both the Comparative Example and Example 2, a silicon wafer was contaminated by spin coating 20 ppm NaOH solution on the substrate for 4 minutes. The contaminated wafers were placed in a reaction chamber and treatment gas (HF/H$_2$O or HF/H$_2$O/SiF$_4$) and treated as described in Example 1. For the HF/H$_2$O process of the comparative example, the flowrates were 30 sccm of HF, 60 sccm of nitrogen before N$_2$ was blown through the water source and 100 sccm of N$_2$ as a sweep gas. For the HF/H$_2$O/SiF$_4$ process the flowrates were 30 sccm of HF, 60 sccm of nitrogen before the H$_2$O—N$_2$ contactor, 30 sccm N$_2$, and 100 sccm of SiF$_4$ mixture. The SiF$_4$ mixture was 560 ppm SiF$_4$ in nitrogen gas. In both processes, the water vapor pressure was maintained at a temperature of 40° C. while the chamber temperature was maintained at about 45° C. by bubbling 60 sccm of nitrogen gas at a pressure of 15 psig through the water at 40° C. The processes were run for 12 minutes.

Figure 2:
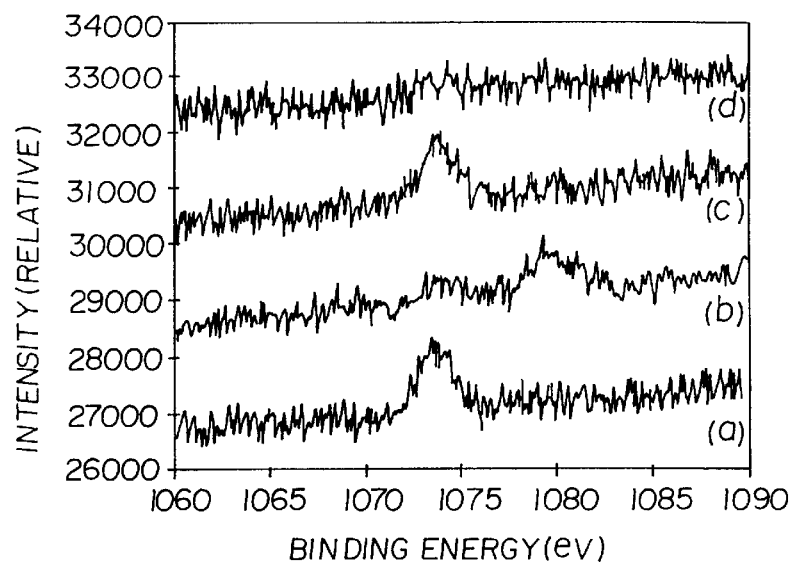
FIG. 2 is a graph showing four sodium 1s XPS spectra two taken respectively of the surface of a sodium contaminated silicon wafer before and after treatment using an $HF/H_2O$ process and two taken respectively before and after a treatment using the inventive process.

FIG. 2 demonstrates the effectiveness of sodium removal using the inventive process. Spectra a) and b), respectively, were acquired before and after treatment using the Comparative Example HF/H$_2$O process. Sodium remained on the surface following the treatment as evidenced by the shifted sodium peak. Spectra c) and d), respectively, were acquired before and after treatment using the Example 2 HF/H$_2$O/SiF$_4$ treatment. The sodium has been removed to the limits of detection in FIG. d) demonstrating the benefit the inventive process has over the standard HF/H$_2$O process. Under other conditions as well, the addition of SiF$_4$ resulted in greater Na removal than was observed using HF/H$_2$O alone.

The above Examples and disclosure are intended to be illustrative and not exhaustive. These examples and description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto.

What is claimed is as follows:

1. A process for treating a surface of a semiconductor substrate in a process chamber, the process comprising the steps of
    a) providing a gaseous reactant mixture comprising:
        i) HF;
        ii) a second compound selected from the group consisting of water and oxygenated organic compounds; and
        iii) a silane compound, selected from the group consisting of halosilanes, tetraalkoxysilanes and hexamethyldisilazane,
            wherein the amount of the silane compound in the mixture is independent of the amount of HF and the second compound;
    b) delivering the gaseous reactant mixture to the surface of the substrate; and
    c) removing volatile products from the process chamber.

2. The process of claim 1 wherein the silane compound is selected from the group consisting of SiF$_4$, SiCl$_4$, SiFCl$_3$, hexamethyldisilazane, tetraethoxysilane, tetramethoxysilane and trifluoromethylsilane.

3. The process of claim 1 wherein the substrate, prior to performing said process, has been subjected to a photoresist ashing procedure.

4. The process of claim 1 wherein the surface comprises silicon.

5. The process of claim 1 wherein the surface of the substrate includes silicon oxide thereon.

6. The process of claim 1 wherein the surface is substantially free of silicon oxide.

7. The process of claim 1 wherein the temperature of the process chamber is from about 0° to about 100°.

8. The process of claim 1 wherein the gas-phase reactive silicon-containing species is provided in an amount that does not result in the deposition of nonvolatile silicon containing compounds on the surface.

9. The process of claim 1 wherein the substrate surface has silicon oxide thereon which is removed from the surface as a result of the process.

10. The process of claim 1 wherein the silane compound is of the form $Si_aF_bCl_c$ where a is a positive integer, and b and c are positive integers or 0 and 2a+2=b+c.

11. The process of claim 1 wherein the oxygenated organic compound is a member selected from the group consisting of alcohols, ketones, aldehydes, and carboxylic acids.

12. The process of claim 11 wherein the alcohol is isopropanol, methanol or ethanol.

13. The process of claim 11 wherein the ketone is acetone or methyl ethyl ketone.

14. The process of claim 11 wherein the aldehyde is formaldehyde or acetaldehyde.

15. The process of claim 11 wherein the carboxylic acid is formic acid or acetic acid.

16. The process of claim 1 wherein said gaseous reactant mixture is diluted with an inert carrier gas.

17. The process of claim 16 where the carrier gas is selected from the group consisting of nitrogen, helium, neon, argon, krypton or xenon.

18. The process of claim 1 wherein the gaseous reactant mixture is provided to the processing chamber at a total pressure of from about 10 torr to about 500 torr.

19. The process of claim 18 wherein the gas-phase reactive silicon-containing species is present in the reaction chamber in a concentration of from about 10 ppm to about 1000 ppm, the HF is present in a concentration of from about 0.1% to about 75% of the gaseous reactant mixture provided to the chamber and the second compound is present in a concentration of from about 1% to about 75% of the gaseous reactant mixture provided to the chamber.

20. The process of claim 1 wherein the substrate surface has a Group 1 or Group 2 metal species thereon which is removed from the surface as a result of the process.

21. The process of claim 20 wherein the metal is selected from the group consisting of Na, Ca, K and mixtures thereof.

22. A process for treating a surface of a semiconductor substrate in a process chamber, the process comprising the steps of
   a) providing a gaseous reactant mixture comprising:
      i) HF;
      iii) a silane compound selected from the group consisting of halosilanes, tetraalkoxysilanes and hexamethyldisilazane; and optionally
      iii) a second compound selected from the group consisting of water, oxygenated organic compounds, active oxygen and mixtures thereof; wherein the amount of the silane compound in the mixture is independent of the amount of HF and the second compound;
   b) delivering the gaseous reactant mixture to the surface of the substrate; and
   c) removing volatile products from the process chamber.

23. The process of claims 22 wherein the surface is exposed to active oxygen prior to exposure to the gaseous reactant mixture.

24. A process for treating a surface of a semiconductor substrate, the substrate in a process chamber, the process comprising the steps of
   a) providing
      a source of HF;
      a source of a second compound selected from the group consisting of water and oxygenated organic compounds; and
      a source of a silane compound, selected from the group consisting of halosilanes, tetraalkoxysilanes and hexamethyldisilazane;
   b) preparing a gaseous reactant mixture by mixing an independently controlled amount HF, an independently controlled amount of the second compound and an independently controlled amount of the silane compound; and subsequently
   c) exposing the surface of the substrate to the gaseous reactant mixture; and
   d) removing volatile products from the process chamber.

25. The process of claim 24 wherein the process temperature is from about 0° C. to about 100° C.

* * * * *